(12) United States Patent
Prabhakar et al.

(10) Patent No.: US 9,997,528 B2
(45) Date of Patent: Jun. 12, 2018

(54) COMPLIMENTARY SONOS INTEGRATION INTO CMOS FLOW

(71) Applicant: Cypress Semicondutor Corporation, San Jose, CA (US)

(72) Inventors: Venkatraman Prabhakar, Pleasanton, CA (US); Krishnaswamy Ramkumar, San Jose, CA (US); Igor Kouznetsov, San Francisco, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days. days.

(21) Appl. No.: 15/077,021

(22) Filed: Mar. 22, 2016

(65) Prior Publication Data
US 2016/0204120 A1 Jul. 14, 2016

Related U.S. Application Data

(63) Continuation of application No. 14/305,122, filed on Jun. 16, 2014.
(Continued)

(51) Int. Cl.
*H01L 21/8238* (2006.01)
*H01L 27/11573* (2017.01)
(Continued)

(52) U.S. Cl.
CPC .. *H01L 27/11573* (2013.01); *H01L 21/28282* (2013.01); *H01L 27/11568* (2013.01);
(Continued)

(58) Field of Classification Search
CPC ......... H01L 27/11573; H01L 27/11531; H01L 27/11568; H01L 21/28282; H01L 21/266; H01L 21/2652
See application file for complete search history.

(56) References Cited

U.S. PATENT DOCUMENTS

| 4,628,340 A * | 12/1986 | Hashimoto | ......... H01L 27/0921 257/373 |
| 6,201,725 B1 * | 3/2001 | Yao | .................... G11C 16/0433 257/E21.69 |

(Continued)

FOREIGN PATENT DOCUMENTS

CN 101548331 A 9/2009

OTHER PUBLICATIONS

Il Hwan Cho, Body-Tied Double-Gate SONOS Flash (Omega Flash) Memory Device Built on a Bulk Si Wafer, Journal of he Korean Physical Society, vol. 44, No. 1, Jan. 2004, pp. 8386.
(Continued)

*Primary Examiner* — Syed Gheyas

(57) ABSTRACT

Methods of integrating complementary SONOS devices into a CMOS process flow are described. In one embodiment, the method begins with depositing a hardmask (HM) over a substrate including a first-SONOS region and a second-SONOS region. A first tunnel mask (TUNM) is formed over the HM exposing a first portion of the HM in the second-SONOS region. The first portion of the HM is etched, a channel for a first SONOS device implanted through a first pad oxide overlying the second-SONOS region and the first TUNM removed. A second TUNM is formed exposing a second portion of the HM in the first-SONOS region. The second portion of the HM is etched, a channel for a second SONOS device implanted through a second pad oxide overlying the first-SONOS region and the second TUNM removed. The first and second pad oxides are concurrently etched, and the HM removed.

21 Claims, 13 Drawing Sheets

Related U.S. Application Data

(60) Provisional application No. 61/936,506, filed on Feb. 6, 2014, provisional application No. 61/915,390, filed on Dec. 12, 2013.

(51) Int. Cl.
  *H01L 27/11568* (2017.01)
  *H01L 29/06* (2006.01)
  *H01L 21/28* (2006.01)
  *H01L 29/423* (2006.01)
  *H01L 21/8234* (2006.01)

(52) U.S. Cl.
  CPC ...... *H01L 29/0649* (2013.01); *H01L 29/4234* (2013.01); *H01L 21/823462* (2013.01)

(56) References Cited

U.S. PATENT DOCUMENTS

| | | | |
|---|---|---|---|
| 6,946,349 B1* | 9/2005 | Lee | H01L 21/823462 257/E21.625 |
| 6,998,309 B2 | 2/2006 | Cho et al. | |
| 7,390,718 B2 | 6/2008 | Roizin et al. | |
| 7,787,303 B2* | 8/2010 | Jenne | G11C 16/0408 365/185.18 |
| 7,807,526 B2 | 10/2010 | Ho et al. | |
| 7,848,148 B2 | 12/2010 | Lue | |
| 8,071,453 B1* | 12/2011 | Ramkumar | H01L 27/11568 438/197 |
| 8,143,129 B2 | 3/2012 | Ramkumar et al. | |
| 8,163,660 B2* | 4/2012 | Puchner | H01L 21/28282 438/786 |
| 8,222,111 B1 | 7/2012 | Hwang | |
| 8,228,726 B2 | 7/2012 | Fang et al. | |
| 8,409,950 B1 | 4/2013 | Shea et al. | |
| 8,546,226 B2 | 10/2013 | Wang et al. | |
| 8,637,916 B2 | 1/2014 | Sun | |
| 2004/0256658 A1* | 12/2004 | Park | H01L 21/76224 257/315 |
| 2005/0186734 A1 | 8/2005 | Cho et al. | |
| 2006/0024951 A1* | 2/2006 | Schuehrer | H01L 21/02063 438/627 |
| 2009/0017625 A1* | 1/2009 | Lee | H01L 21/31144 438/694 |
| 2010/0149625 A1* | 6/2010 | Lu | B81C 1/00238 359/291 |
| 2010/0178772 A1* | 7/2010 | Lin | H01L 21/28088 438/703 |
| 2013/0210209 A1 | 8/2013 | Ramkumar | |
| 2013/0249010 A1 | 9/2013 | Ng et al. | |

OTHER PUBLICATIONS

International Search Report for International Application No. PCT/US2014/066545 dated Feb. 20, 2015; 2 pages.

Mingcong Chen et al., Vertical-Si-Nanowire SONOS Memory for Ultrahigh-Density Application, IEEE Electron Device Letters. vol. 30, No. 8, Aug. 2009.

Ramkumar, K., Benefits of SONOS memory for embedded flash, www.eetasia.com/STATIC/PDF/201110/EEOL_2011OCT13_EMS_STOR_TA_01.pdf?Sources=Download, captured-printed Apr. 14, 2014.

Ramkumar, K.., A scalable, low-voltage, low cost SONOS memory technology for embedded NVM applications, http://ieeexplore.ieee.org/xpl/articleDetails.jsp?reload=true&tp=&arnumber=6582134&url=http%3A%2F%2Fieeexplore.ieee.org%2Fpls%2Fabs_all.jsp%3D6582134, captured-printed Apr. 14, 2014.

The Future of Embedded Flash, www.gsaglobal.org/forum/2010/1/docs/201001_gsa_forum.pdf,captured-printed Apr. 14, 2014.

U.S. Advisory Action for U.S. Appl. No. 14/305,122 dated Jun. 12, 2015; 4 pages.

U.S. Final Rejection for U.S. Appl. No. 14/305,122 dated Mar. 25, 2015; 22 pages.

U.S. Non-Final Rejection for U.S. Appl. No. 14/305,122 dated Dec. 1, 2014; 20 pages.

U.S. Non-Final Rejection for U.S. Appl. No. 141305,122 dated May 25, 2016; 26 pages.

U.S. Notice of Allowance for U.S. Appl. No. 14/305,122 dated Nov. 27, 2015; 10 pages.

Written Opinion of the International Searching Authority for International Application No. PCT/US2014/066545 dated Feb. 20, 2015; 5 pages.

U.S. Appl. No. 14/305,122 "Complementary SONOS Integration Into CMOS Flow," Venkatraman Prabhakar et al., filed Jun. 16, 2014; 50 pages.

U.S. Advisory Action for U.S. Appl. No. 14/305,122 dated Aug. 14, 2017; 4 pages.

U.S. Advisory Action for U.S. Appl. No. 14/305,122 dated Nov. 15, 2016; 4 pages.

U.S. Final Rejection for U.S. Appl. No. 14/305,122 dated May 18, 2017; 28 pages.

U.S. Final Rejection for U.S. Appl. No. 14/305,122 dated Sep. 7, 2016; 17 pages.

U.S. Non Final Rejection for U.S. Appl. No. 14/305,122 dated Mar. 2, 2017; 15 pages.

U.S. Appl. No. 15/708,008: "Complementary SONOS Integration Into CMOS Flow" Venkatraman Prabhakar et al., filed Sep. 18, 2017; 51 pages.

U.S. Non Final Rejection for U.S. Appl. No. 15/708,008 dated Nov. 15, 2017; 35 pages.

USPTO Notice of Allowance for U.S. Appl. No. 15/708,008 dated Apr. 2, 2018; 8 pages.

SIPO Office Action for Application No. 201480050479.8 dated Feb. 2, 2018; 13 pages.

Taiwan Office Action for Application No. 10720226920 dated Mar. 16, 2018; 3 pages.

* cited by examiner

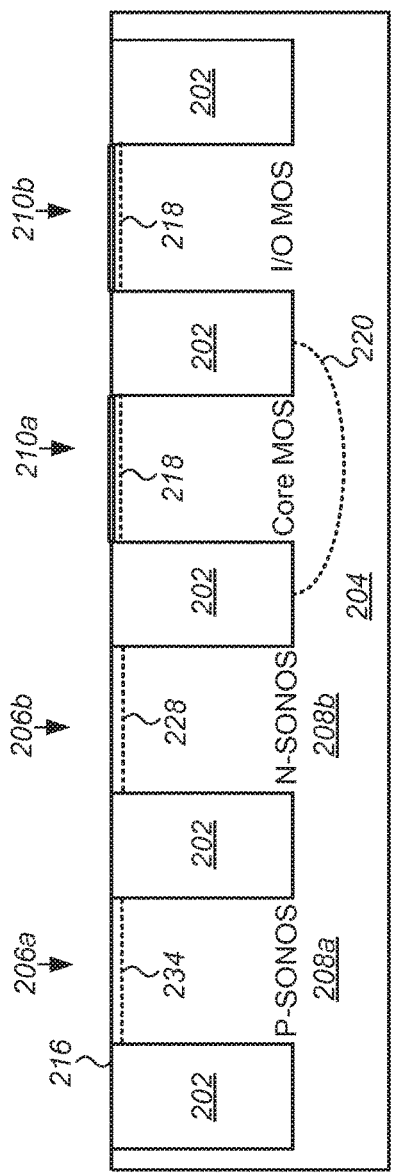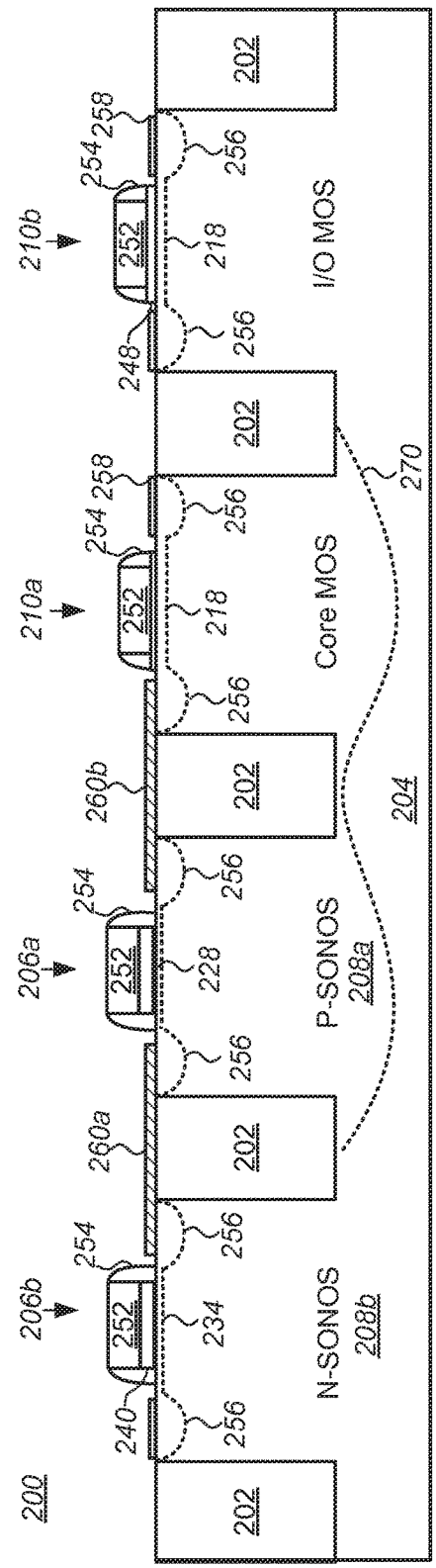

COMPLIMENTARY SONOS INTEGRATION INTO CMOS FLOW

CROSS-REFERENCE TO RELATED APPLICATIONS

This application is a continuation of U.S. patent application Ser. No. 14/305,122 filed Jun. 16, 2014, which claims the benefit of U.S. Provisional Patent Application Ser. No. 61/936,506, filed Feb. 6, 2014, and of U.S. Provisional Patent Application Ser. No. 61/915,390 filed Dec. 12, 2013, all of which are incorporated by reference herein.

TECHNICAL FIELD

The present disclosure relates generally to semiconductor devices, and more particularly to memory cells including embedded or integrally formed silicon-oxide-nitride-oxide-semiconductor (SONOS) devices and metal-oxide-semiconductor (MOS) devices and methods for fabricating the same.

BACKGROUND

For many applications, such as system-on-chip (SOC) architecture, it is desirable to integrate logic devices and interface circuits based upon MOS transistors or devices and silicon-oxide-nitride-oxide-semiconductor (SONOS) transistors or devices, on a single chip or substrate to create non-volatile memory (NVM). MOS devices are typically fabricated using a standard or baseline complementary-metal-oxide-semiconductor (CMOS) process flows. SONOS devices include charge-trapping gate stacks in which a stored or trapped charge changes a threshold voltage of the non-volatile memory device to store information as a logic 1 or 0. The integration of these dissimilar devices in SOC architecture is challenging and becomes even more problematic when attempting to form complementary N and P-type SONOS devices with CMOS devices on a single chip or integrated circuit (IC).

SUMMARY

Methods of integrating complementary SONOS devices into a CMOS process flow are described. The method begins with depositing a hardmask (HM) over a substrate including a P-SONOS region and an N-SONOS region. In several embodiments, the substrate further includes a MOS region in which a number of MOS devices are to be formed and the HM is concurrently deposited over the MOS region. A first tunnel mask (TUNM) is formed over the HM exposing a first portion of the HM in the N-SONOS region. The first portion of the HM is etched, the channel for a N-type SONOS device implanted through a first pad oxide overlying the N-SONOS region and the first TUNM removed. A second TUNM is formed exposing a second portion of the HM in the P-SONOS region. The second portion of the HM is etched, a channel for a P-type SONOS device implanted through a second pad oxide overlying the P-SONOS region and the second TUNM removed. The first and second pad oxides are concurrently etched, and the HM removed.

BRIEF DESCRIPTION OF THE DRAWINGS

Embodiments of the Present Invention Will be Understood More Fully from the Detailed Description that Follows and from the Accompanying Drawings and the Appended Claims Provided Below, where:

FIGS. 4A-4J are block diagrams illustrating cross-sectional views of a portion of a memory cell during fabrication of the memory cell according to the method of FIG. 3; and FIG. 5 is a block diagram illustrating cross-sectional views of a portion of a memory cell during fabrication of the memory cell according to an alternative embodiment of either the method of FIG. 1 or FIG. 3.

DETAILED DESCRIPTION

Figure 1:
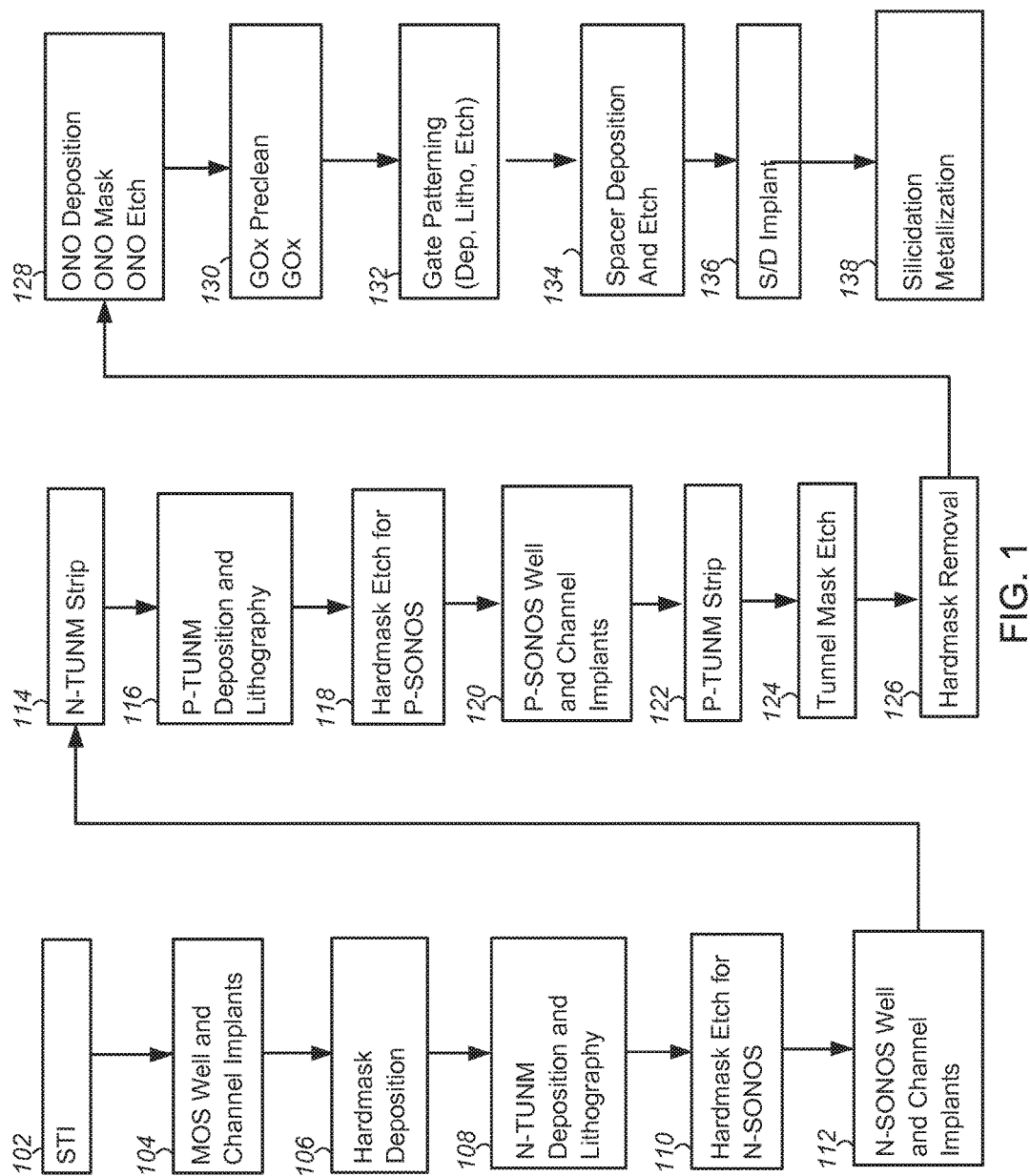
FIG. 1 is a flowchart illustrating an embodiment of a method for fabricating a memory cell including complementary silicon-oxide-nitride-oxide-semiconductor (SONOS) devices and a metal-oxide-semiconductor (MOS) devices.

Embodiments of methods of integrating complementary silicon-oxide-nitride-oxide-semiconductor (CSONOS) into a complementary metal-oxide-semiconductor (CMOS) fabrication process or process flow to produce non-volatile memory (NVM) cells are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiment.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Briefly, in one embodiment the method begins with depositing a hardmask (HM) over a surface of a substrate including a first-SONOS region and a second-SONOS region in which a pair of complementary SONOS devices are to be formed. A first tunnel mask (TUNM) is formed over the HM exposing a first portion of the HM in the second-SONOS region, the first portion of the HM is etched, and a channel for a first SONOS device implanted through a first pad oxide overlying the second-SONOS region after which the first TUNM is removed. Next, a second TUNM is formed over the HM exposing a second portion of the HM in the first-SONOS region, the second portion of the HM is etched, and a channel for a second SONOS device implanted through a second pad oxide overlying the first-SONOS region after which the second TUNM is removed. Finally, the first and second pad oxides in the first-SONOS region and second-SONOS regions are concurrently etched, and the HM removed. The first and second SONOS regions are or will be doped with opposite types of dopants. Thus, although in the following exemplary embodiments the first-SONOS region is described as being a P-SONOS region and the second-SONOS region as an N-SONOS region, it will be understood that in other embodiments, the first-SONOS region may be an N-SONOS region and the second-SONOS region a P-SONOS region without departing from the scope of the invention.

The CSONOS devices may include devices or transistors implemented using Silicon-Oxide-Nitride-Oxide-Silicon (SONOS) or Metal-Oxide-Nitride-Oxide-Silicon (MONOS) technology.

Figure 2A:
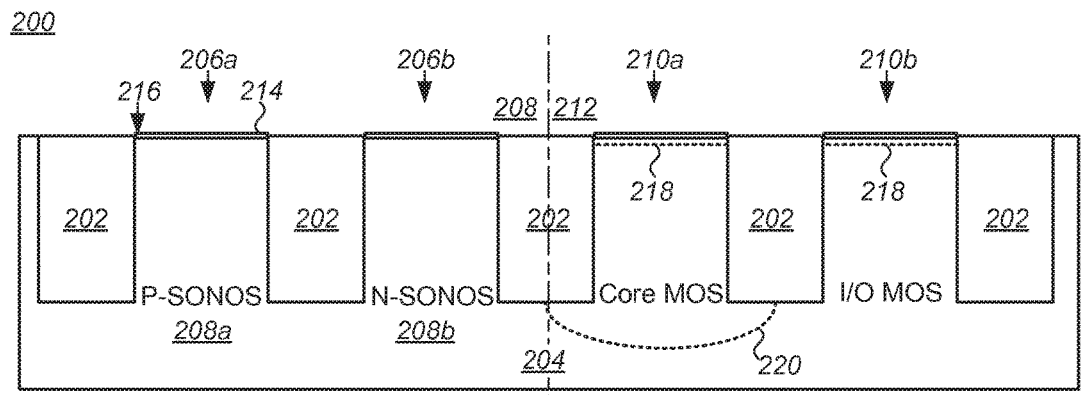
FIGS. 2A-2S are block diagrams illustrating cross-sectional views of a portion of a memory cell during fabrication of the memory cell according to the method of FIG. 1.

An embodiment of a method for integrating or embedding CSONOS into a CMOS process flow will now be described in detail with reference to FIG. 1 and FIGS. 2A through 2S. FIG. 1 is a flowchart illustrating an embodiment of a method or process flow in which a hardmask is deposited over a surface of substrate before tunnel masks (TUNM) are formed for the CSONOS and SONOS wells and/or channels implanted. FIGS. 2A-2S are block diagrams illustrating cross-sectional views of a portion of a memory cell 200, including a pair of complementary SONOS devices and a pair or a number of MOS devices, two of which are shown, during fabrication of the memory cell according to the method of FIG. 1. In one embodiment, the pair of MOS devices is a pair of complementary MOS (CMOS) devices.

Referring to FIG. 1 and FIG. 2A, the process begins with forming a number of isolation structures 202 in a wafer or substrate 204 (step 102). The isolation structures 202 isolate the memory cell being formed from memory cells formed in adjoining areas (not shown) of the substrate 204 and/or isolate the pair of complementary SONOS devices 206a-206b being formed in a SONOS region 208 of the substrate from one another, and from a number of MOS devices 210a-210b being formed in one or more adjoining MOS regions 212, only one of which is shown.

It is noted that in the embodiment shown the pair of complementary SONOS devices include a p-type SONOS device (P-SONOS 206a) formed in a P-SONOS region 208a, and a N-type SONOS device (N-SONOS 206b) formed in a N-SONOS region 208b. By P-type SONOS device it is meant a device having a channel region doped with a P-type, acceptor dopant such as boron. Similarly, by N-type SONOS device it is meant a device having a channel region doped with an N-type, donor dopant such as phosphorus or arsenic.

It is noted that the number of MOS devices 210a-210b can include both low-voltage field effect transistors (LV-FET) in a core of a non-volatile memory (NVM) and high-voltage field effect transistors (HV-FET) in an input/output (I/O) circuit of the NVM. For purposes of explanation and to simplify the figures the MOS devices 210a-210b are shown as including a LV-FET 210a in the core of the NVM and a HV-FET 210b in the I/O circuit of the NVM. Although not shown in this figure, it will be understood the MOS devices 210a-210b can be and generally are one half of a complementary pairs of CMOS in the core and/or the I/O circuit of the NVM, all of which are integrally and concurrently formed along with the pair of the CSONOS devices.

The isolation structures 202 include a dielectric material, such as an oxide or nitride, and may be formed by any conventional technique, including but not limited to shallow trench isolation (STI) or local oxidation of silicon (LOCOS). The substrate 204 may be a bulk wafer composed of any single crystal or polycrystalline material suitable for semiconductor device fabrication, or may include a top epitaxial layer of a suitable material formed on a substrate. Suitable materials include, but are not limited to, silicon, germanium, silicon-germanium or a III-V compound semiconductor material.

A pad oxide 214 is formed over a surface 216 of the substrate 204 in both the NVM region 208 and the MOS regions 212. The pad oxide 214 can be silicon dioxide ($SiO_2$) having a thickness of from about 10 nanometers (nm) to about 20 nm and can be grown by a thermal oxidation process or in-situ steam generation (ISSG).

Referring again to FIG. 1 and FIG. 2A, dopants are then implanted into substrate 204 through the pad oxide 214 to form channels 218 and wells 220 for one or more of the MOS devices 210a-210b that will be formed in the MOS region 212 (step 104). Generally, this involves several separate deposition, lithography, implant and stripping processes to implant swells and channels for different types of devices, formed in different areas, i.e., the core or I/O circuit of the NVM. For example, to perform well and channel implants of a N-type MOS device in the core, core MOS 210a, a photoresist layer is deposited and patterned using standard lithographic techniques to block or shield both the SONOS region 208 and P-type devices in the MOS region 212, and implanting an appropriate ion species at an appropriate energy to an appropriate concentration. For example, $BF_2$ can be implanted at an energy of from about 10 to about 100 kilo-electron volts (keV), and a dose of from about 1e12 $cm^{-2}$ to about 1e14 $cm^{-2}$ to form an N-type MOS (NMOS) transistor. A P-type MOS (PMOS) transistor may likewise be formed by implantation of Arsenic or Phosphorous ions at any suitable dose and energy. It is to be understood that implantation can be used to form channels 218, in all of the MOS regions 212 at the same time, or at separate times using standard lithographic techniques, including a patterned photoresist layer to mask one of the MOS regions. After the implants have been performed, the patterned resist layer is stripped in either an ashing process using oxygen plasma, or in a photoresist strip using a commercially available strip or solvent. Another photoresist layer is deposited and patterned to block or shield both the SONOS region 208 and N-type devices in the MOS region 212 prior to performing well and channel implants of a P-type MOS device in the core. The process is then repeated for the MOS devices in the MOS device in the I/O circuit, I/O MOS 210b.

Figure 2B:
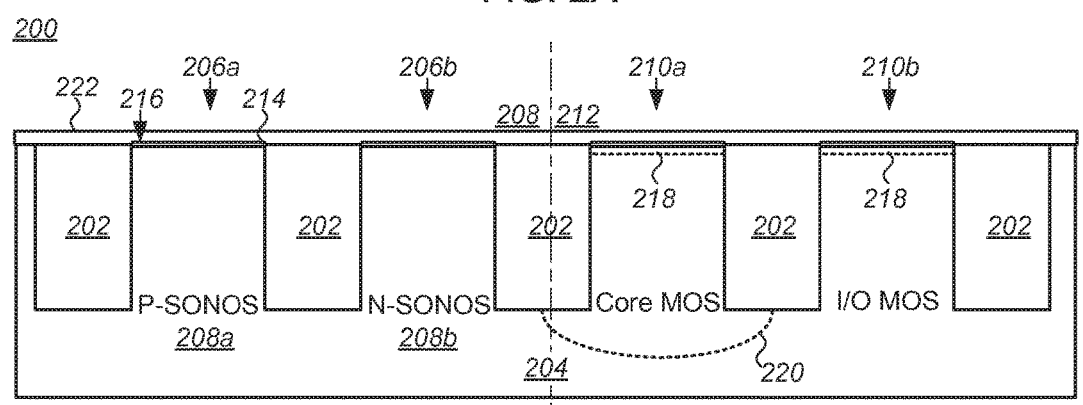

Next, referring to FIG. 1 and FIG. 2B and hardmask 222 is deposited over the surface 216 of the substrate 204 (step 106). Generally, the hardmask 222 is formed concurrently over both the P-SONOS region 208a and the N-SONOS region 208B. In some embodiments, such as that shown, the hardmask 222 is formed concurrently over substantially the entire surface 216 of the substrate 204, including both the P-SONOS region 208a and the N-SONOS region 208b and the MOS region 212.

Generally, the hardmask 222 can include one or more layers of material that can be patterned or opened using photoresist and standard lithographic techniques, but which is not itself photosensitive and protects underlying surface and structures formed therein from the photoresist and lithographic processes as well as from implants and etch process performed through openings formed in the hardmask. Suitable materials for the hardmask 222 include, for example, a layer of from about 5 to about 20 nm of silicon nitride ($Si_xN_y$), or silicon oxynitride (SiON) deposited by any known nitride deposition process. For example, in one embodiment a nitride hardmask is formed in step 106 in a low pressure chemical vapor deposition (LPCVD) process using a silicon source, such as silane ($SiH_4$), dichlorosilane ($SiH_2Cl_2$), tetrachlorosilane ($SiCl_4$) or BisTertiaryButylAmino Silane (BTBAS), and a nitrogen source, such as $NH_3$ and $N_2O$.

Figure 2C:
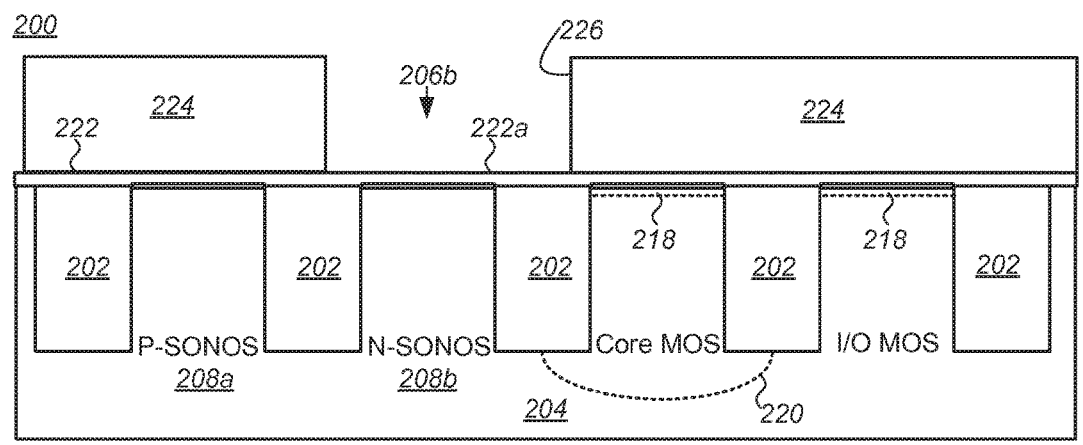

Next, referring to FIG. 1 and FIG. 2C a first tunnel mask (TUNM 224) is formed by depositing a photoresist layer on or overlying substantially an entire surface of the hardmask 222, patterning the photoresist layer using standard lithographic techniques (step 108). Because an opening 226 in the patterned photoresist layer exposes a first portion of the HM 222 in the N-SONOS region 208b, the first TUNM 224 may also be referred to as the N-TUNM.

Figure 2D:
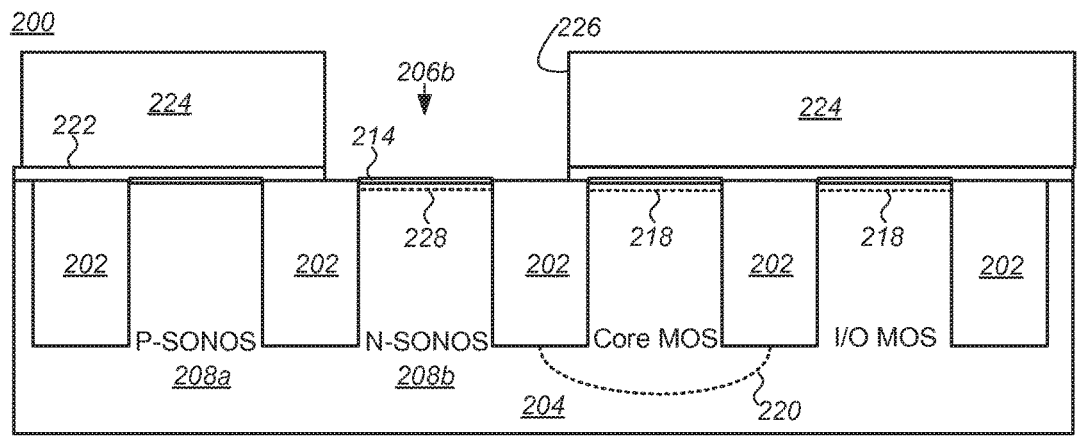

Referring to FIG. 1 and FIG. 2D, the first portion of the HM exposed through the opening 226 in the first or N-TUNM 224 is etched or removed using any suitable wet or dry etching technique, depending on the material of the hardmask and the underlying structures or layers (step 110). For example, in those embodiments in which the hardmask 222 includes a layer of silicon nitride overlying a pad oxide 214, the hardmask can be etched using a standard low pressure nitride etch at a moderate power (about 500 W) in a plasma of a fluorine containing gas, such as $CF_4$ or $CHF_3$, which exhibits good selectivity to silicon oxides, such as the silicon dioxide ($SiO2$) of the underlying pad oxide 214 and/or the STI 202 structures.

Next, referring again to FIG. 1 and FIG. 2D, dopants of an appropriate energy and concentration are implanted through the opening in the hardmask 222 and the pad oxide 214 to form a channel 228 for the N-SONOS device 206b, and, optionally, a well (not shown in this figure) in which the channel for the N-SONOS device is formed (step 112). In one embodiment, the well can be implanted with boron ion ($BF_2$) at an energy of from about 100 to about 500 kilo-electron volts (keV), and a dose of from about $1E12/cm^2$ to about $5E13/cm^2$ to form a Pwell. The channel 228 can be implanted with Arsenic or Phosphorous ions at an energy of from about 50 to about 500 kilo-electron volts (keV), and a dose of from about $5e11\ cm^{-2}$ to about $5e12\ cm^{-2}$ to form a N-SONOS device 206b.

Figure 2E:
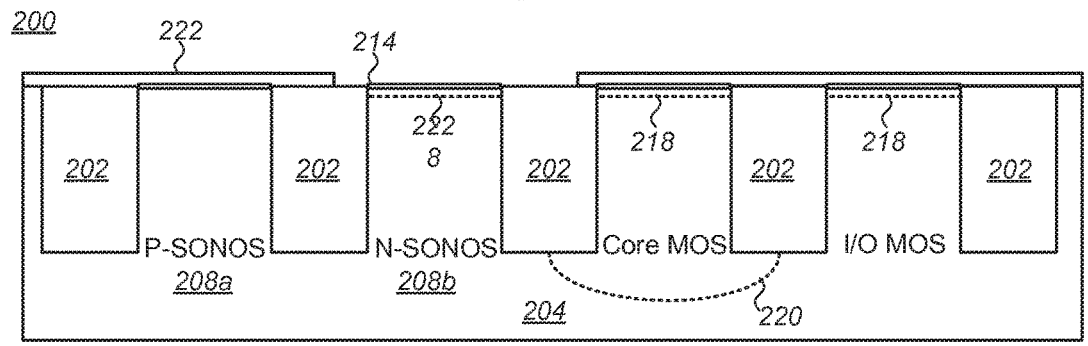

Referring to FIG. 1 and FIG. 2E, the first or N-TUNM 224 is removed or stripped in either an ashing process using oxygen plasma, or a photoresist strip or solvent (step 114).

Figure 2F:
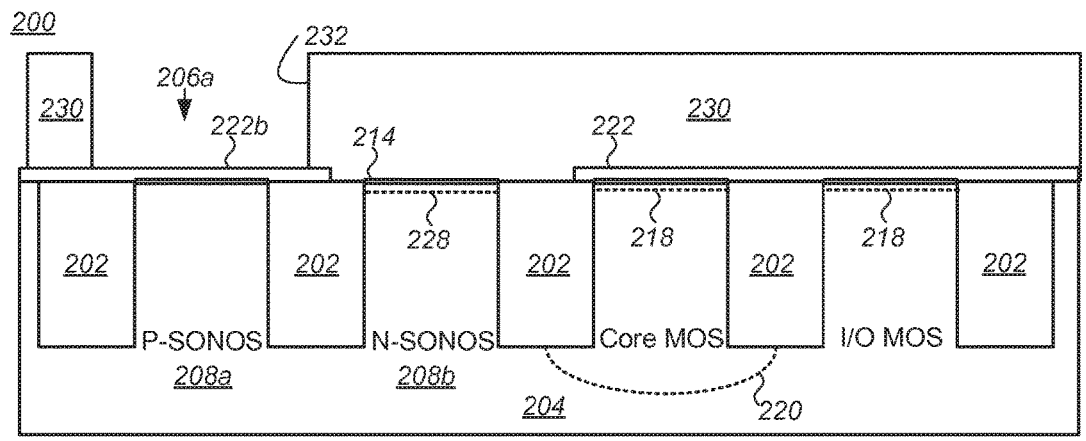

Next, referring to FIG. 1 and FIG. 2F a second tunnel mask (TUNM 230) is formed by depositing a photoresist layer on or over substantially an entire surface of the hardmask 222 and the surface 216 of the substrate 204 exposed by the first hardmask etch step, and patterned using standard lithographic techniques (step 116). Because an opening 232 in the patterned photoresist layer exposes a second portion of the hardmask 222 in the P-SONOS region 208a, the second TUNM 230 may also be referred to as the P-TUNM. It is noted that the pad oxide 214 isolates the surface 216 of the substrate 204 from the photoresist of second TUNM 230 in the N-SONOS region 208b.

Figure 2G:
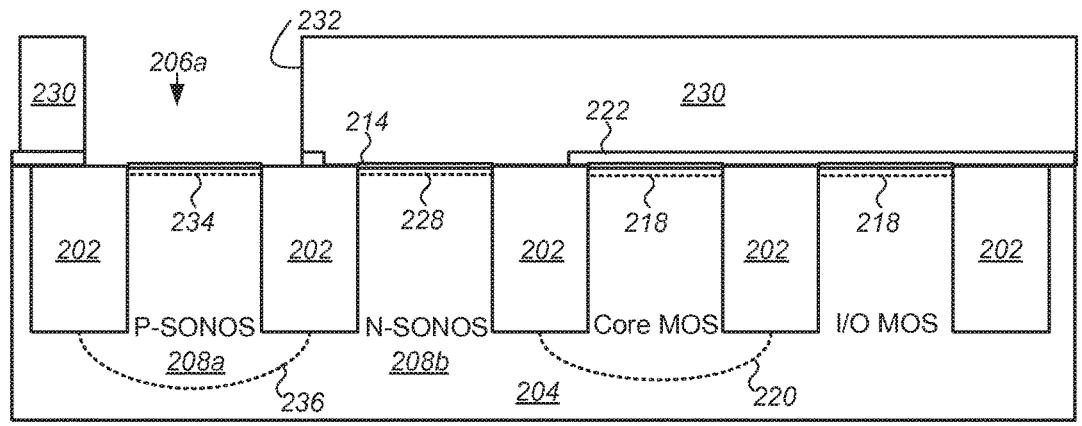

Referring to FIG. 1 and FIG. 2G, the second portion of the hardmask 222 exposed through the opening 232 in the second or P-TUNM 230 is etched or removed using any suitable wet or dry etching technique, depending on the material of the hardmask and the underlying structures or layers (step 118). For example, as described above in connection with N-TUNM 224, in those embodiments in which the hardmask 222 includes a layer of silicon nitride overlying a pad oxide 214, the hardmask can be etched using a standard low pressure nitride etch at a moderate power (about 500 W) in a plasma of a fluorine containing gas, such as $CF_4$, or $CHF_3$, which exhibits good selectivity to silicon oxides, such as the silicon dioxide ($SiO2$) of the underlying pad oxide 214 and/or the STI 202 structures.

Referring again to FIG. 1 and FIG. 2G, dopants of an appropriate energy and concentration are implanted through the opening in the hardmask 222 and the pad oxide 214 to form a channel 234 and a well or deep well 236 in which the P-SONOS device 206a is formed (step 120). In one embodiment, the well can be implanted with Arsenic or Phosphorous at an energy of from about 200 to about 1000 kilo-electron volts (keV), and a dose of from about $1E12/cm^2$ to about $5E13/cm^2$ to form a deep Nwell. The channel 234 can be implanted with boron ions ($BF_2$) at an energy of from about 10 to about 100 kilo-electron volts (keV), and a dose of from about $1e12\ cm^{-2}$ to about $1e13\ cm^{-2}$ to form a P-SONOS device 206a.

Figure 2H:
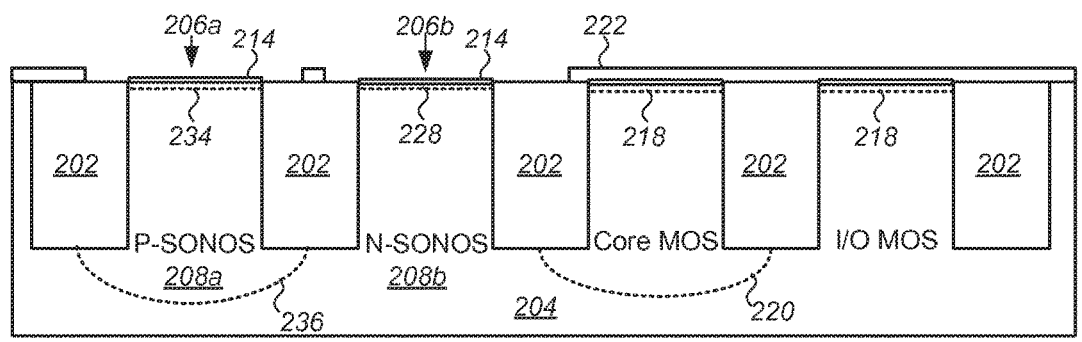

Referring to FIG. 1 and FIG. 2H, the second or P-TUNM 230 is removed or stripped in either an ashing process using oxygen plasma, or a photoresist strip or solvent (step 122).

Figure 2I:
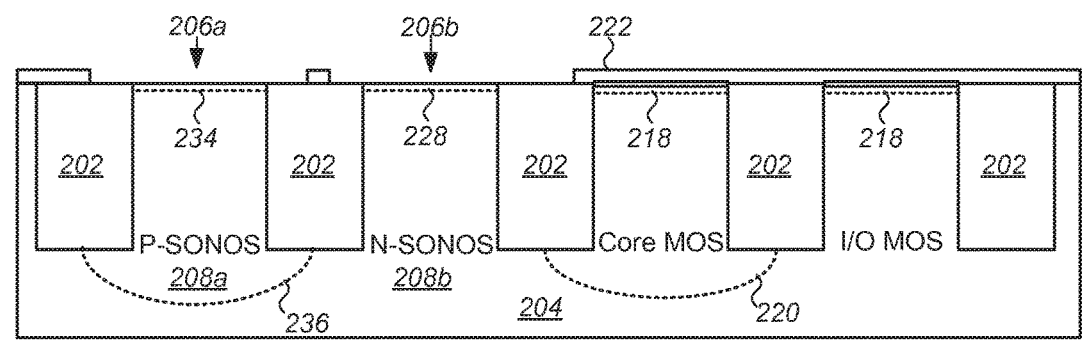

Next referring to FIG. 1 and FIG. 2I, the pad oxide 214 over both the P-SONOS region 208a and the N-SONOS region 208b is concurrently removed in a tunnel mask etch through the openings previously formed in the hardmask 222 (step 124). The tunnel mask etch can be accomplished, for example, in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry.

Figure 2J:
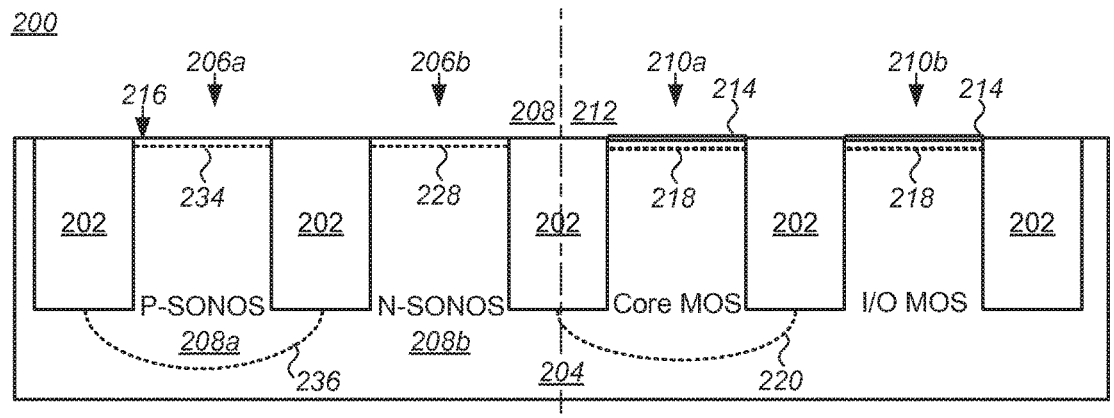

Referring to FIG. 1 and FIG. 2J, the hardmask 222 is substantially entirely stripped or removed (step 126). The hardmask 222 can be removed using the same process and chemistry previously used to form openings in the hardmask. For example, in embodiments in which the hardmask 222 includes a silicon nitride layer, it can be removed using a standard low pressure nitride etch at a moderate power (about 500 W) in a plasma of a fluorine containing gas, such as $CF_4$, or $CHF_3$, which exhibits good selectivity to silicon oxides, such as the silicon dioxide ($SiO2$) of the pad oxide 214 remaining over the MOS devices 210a-210b in the MOS region 212 and the STI 202 structures, and to the underlying silicon of the substrate in the SONOS region 208. Alternatively, the silicon nitride can also be removed by a wet etch using Phosphoric acid ($H_3PO_4$) at a temperature of about 150° C. to 160° C.

Figure 2K:
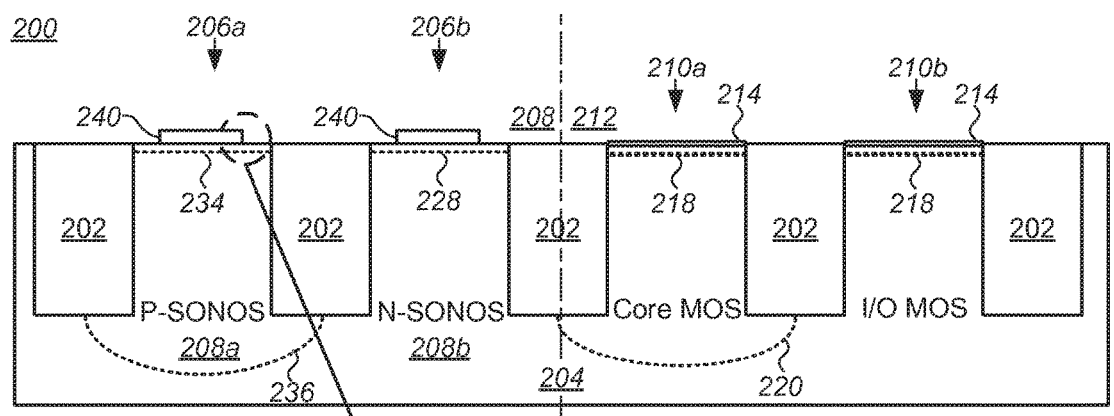
Figure 2L:
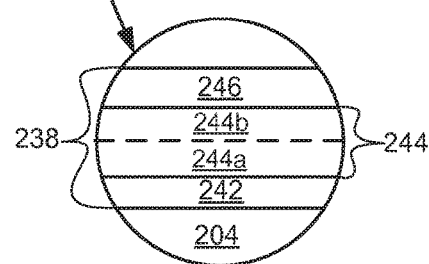

Referring to FIG. 1 and FIGS. 2K through 2L, a number of dielectric or oxide-nitride-oxide (ONO) layers, shown collectively as dielectric layers 238 in FIG. 2L, are formed or deposited over the surface 216 of the substrate 204, a mask formed on or overlying the dielectric layers, and the dielectric layers etched to form ONO or dielectric stacks 240 of the N-SONOS device 206b and the P-SONOS device 206a in the N-SONOS region 208b and the P-SONOS region 208a (step 128).

Referring to FIG. 2L, the number of dielectric layers 238 includes a tunneling layer 242 overlying the surface 216 of the substrate 204, a charge-trapping layer 244 overlying the tunneling layer and a blocking layer 246 overlying the charge-trapping layer. The tunneling layer 242 may be any material and have any thickness suitable to allow charge carriers to tunnel into an overlying charge-trapping layer under an applied gate bias while maintaining a suitable barrier to leakage when the SONOS devices (P-SONOS device 206a and N-SONOS device 206b) are unbiased. In certain embodiments, tunneling layer 242 is silicon dioxide, silicon oxy-nitride, or a combination thereof and can be grown by a thermal oxidation process, using ISSG or radical oxidation.

In one embodiment a silicon dioxide tunneling layer 242 may be thermally grown in a thermal oxidation process. For example, a layer of silicon dioxide may be grown utilizing dry oxidation at 740 degrees centigrade (° C.)-800° C. in an oxygen containing gas or atmosphere, such as oxygen ($O_2$) gas. The thermal oxidation process is carried out for a duration approximately in the range of 50 to 150 minutes to effect growth of a tunneling layer 242 having a thickness of from about 1.0 nanometers (nm) to about 3.0 nm by oxidation and consumption of the exposed surface of substrate.

In another embodiment a silicon dioxide tunneling layer 242 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and O2 are permitted to react at a temperature approximately in the range of about 900° C. to about 1000° C. at a pressure approximately in the range of about 0.5 to about 5 Torr to form radicals, such as, an OH radical, an $HO_2$ radical or an oxygen (O) diradical, at the surface of substrate. The radical oxidation process is carried out for a duration approximately in the range of about 1 to 10 minutes to effect growth of a tunneling layer 242 having a thickness of from about 1.0 nanometers (nm) to about 4.0 nm by oxidation and consumption of the exposed surface of substrate. It will be understood that in this and in subsequent figures the thickness of tunneling layer 242 is exaggerated relative to the pad oxide 214, which is approximately 7 times thicker, for the purposes of clarity. A tunneling layer 242 grown in a radical oxidation process is both denser and is composed of substantially fewer hydrogen atoms/cm$^3$ than a tunneling layer formed by wet oxidation techniques, even at a reduced thickness. In certain embodiments, the radical oxidation process is carried out in a batch-processing chamber or furnace capable of processing multiple substrates to provide a high quality tunneling layer 242 without impacting the throughput (wafers/hr.) requirements that a fabrication facility may require.

In another embodiment, tunneling layer 242 is deposited by chemical vapor deposition (CVD) or atomic layer deposition and is composed of a dielectric layer which may include, but is not limited to silicon dioxide, silicon oxy-nitride, silicon nitride, aluminum oxide, hafnium oxide, zirconium oxide, hafnium silicate, zirconium silicate, hafnium oxy-nitride, hafnium zirconium oxide and lanthanum oxide. In another embodiment, tunneling layer 242 is a multilayer tunneling layer including at least a bottom layer of a material such as, but not limited to, silicon dioxide or silicon oxy-nitride and a top layer of a material which may include, but is not limited to silicon nitride, aluminum oxide, hafnium oxide, zirconium oxide, hafnium silicate, zirconium silicate, hafnium oxy-nitride, hafnium zirconium oxide and lanthanum oxide.

Referring again to FIG. 2L, a charge-trapping layer 244 is formed on or overlying the tunneling layer 242. Generally, as in the embodiment shown, the charge-trapping layer is a multilayer charge-trapping layer having multiple layers including at least an oxygen-rich, substantially charge trap free lower or first charge-trapping layer 244a closer to the tunneling layer 242, and an upper or second charge-trapping layer 244b that is silicon-rich and oxygen-lean relative to the first charge-trapping layer and comprises a majority of a charge traps distributed in multilayer charge-trapping layer.

The first charge-trapping layer 244a of a multilayer charge-trapping layer 244 can include a silicon nitride ($Si_3N_4$), silicon-rich silicon nitride or a silicon oxy-nitride ($SiO_xN_y$ ($H_z$)). For example, the first charge-trapping layer 244a can include a silicon oxynitride layer having a thickness of between about 1.5 nm and about 4.0 nm formed by a CVD process using dichlorosilane (DCS)/ammonia ($NH_3$) and nitrous oxide ($N_2O$)/$NH_3$ gas mixtures in ratios and at flow rates tailored to provide a silicon-rich and oxygen-rich oxynitride layer.

The second charge-trapping layer 244b of the multilayer charge-trapping layer is then formed over the first charge-trapping layer 244a. The second charge-trapping layer 244b can include a silicon nitride and silicon oxy-nitride layer having a stoichiometric composition of oxygen, nitrogen and/or silicon different from that of the first charge-trapping layer 244a. The second charge-trapping layer 244b can include a silicon oxynitride layer having a thickness of between about 2.0 nm and about 10.0 nm, and may be formed or deposited by a CVD process using a process gas including DCS/$NH_3$ and $N_2O$/$NH_3$ gas mixtures in ratios and at flow rates tailored to provide a silicon-rich, oxygen-lean top nitride layer.

As used herein, the terms "oxygen-rich" and "silicon-rich" are relative to a stoichiometric silicon nitride, or "nitride," commonly employed in the art having a composition of ($Si_3N_4$) and with a refractive index (RI) of approximately 2.0. Thus, "oxygen-rich" silicon oxynitride entails a shift from stoichiometric silicon nitride toward a higher wt. % of silicon and oxygen (i.e. reduction of nitrogen). An oxygen rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher wt. % of silicon with less oxygen than an "oxygen-rich" film. A silicon-rich silicon oxynitride film is therefore more like silicon and the RI is increased toward the 3.5 RI of pure silicon.

Referring again to FIG. 2L, the number of dielectric layers further includes a blocking dielectric layer or blocking layer 246 that is formed on or overlying the charge-trapping layer 244. In one embodiment, the blocking layer 246 can include an oxidized portion of the silicon nitride of the underlying second charge-trapping layer 244b, which is subsequently oxidized by in-situ-steam-generation (ISSG), or radical oxidation to form the blocking layer 246. In other embodiments, the blocking layer 246 can include a silicon oxide ($SiO_2$) or a silicon oxynitride (SiON), deposited by CVD, and performed in a batch or single substrate processing chamber with or without an ignition event such as plasma. The blocking layer 246 can be a single layer of silicon oxide, having a substantially homogenous composition, a single layer of silicon oxynitride having a gradient in stoichiometric composition, or, as in embodiments described below, can be a multilayer blocking layer including at least a lower or first blocking layer overlying the second charge-trapping layer 244b, and a second blocking layer overlying the first blocking layer.

In one embodiment, the blocking layer 246 can include a silicon nitride, a silicon-rich silicon nitride or a silicon-rich silicon oxynitride layer having a thickness of between 2.0 nm and 4.0 nm formed by a CVD process using $N_2O/NH_3$ and $DCS/NH_3$ gas mixtures.

Figure 2M:
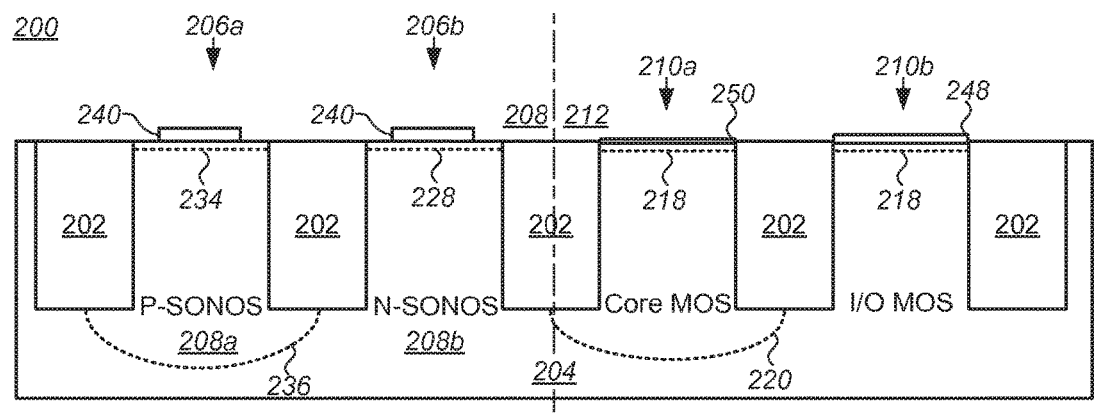

Referring to FIGS. 1 and 2M, a gate oxide or GOX preclean is performed, and gate oxides for MOS transistors 210a-210b formed (step 130). Referring to FIG. 2M, the GOX preclean removes the remaining pad oxides 214 in the MOS regions 212 and at least a portion of the blocking layer 246 in a highly selective cleaning process. This cleaning process prepares the substrate 204 in the MOS region 212 for gate oxide growth. In one exemplary implementation the pad oxide 214 is removed in a wet clean process. Alternatively, the wet clean process can be performed using a 20:1 BOE wet etch, a 50:1 hydrofluoric (HF) wet etch, a pad etch, or any other similar hydrofluoric-based wet etching chemistry. In other embodiments, the cleaning process chemistry is chosen so as to remove only a negligible portion of the blocking layer 246.

In some embodiments, such as that shown in FIG. 2M, the oxidation process to form gate oxides for MOS transistors 210a-210b is a dual gate oxidation process to enable fabrication of both a first, thick, gate oxide 248 over the surface 216 of the substrate 204 in part of the MOS region 212 for a HV transistor, such as I/O MOSFET 210b in the I/O circuit of the NVM, and a second, thinner gate oxide 250 for LV transistors, such as core MOSFET 210a. Generally, the dual gate oxidation process involves forming the thicker gate oxide 248 over substantially all of the MOS region 212, using any known oxidation process in accordance with the methods described herein, forming a patterned photoresist mask using standard lithographic techniques covering the I/O MOSFET 210b and NVM region 208, and removing the thick gate oxide covering core MOSFET 210a by a wet etch process using a 10:1 buffered oxide etch (BOE) containing a surfactant, after which the photoresist mask is stripped or removed, and the second, thinner gate oxides 250 grown or deposited. The thinner gate oxides 250 can be grown, for example, to a thickness from about 1 nm to about 3 nm. It will be understood that, by controlling the thickness of the thick gate oxide 248 as initially formed there is no need to form an additional photoresist mask over the I/O MOSFET 210b during subsequent formation of the thinner gate oxide 250 since the additional oxide merely adds insubstantially to the thickness of the thick gate oxide. Similarly, the oxidation process to form the thinner gate oxides 250 will have little to no detrimental impact on the blocking layer 246.

In another embodiment, the oxidation process to form the thick gate oxide 248 is also used to concurrently form a high temperature oxide (HTO) over the dielectric stack 240 of the SONOS devices 206 to provide a thicker oxide blocking layer 246 or an additional HTO layer of a multilayer blocking layer. The oxidation process can include in-situ-steam-generation (ISSG), CVD, or radical oxidation performed in a batch or single substrate processing chamber with or without an ignition event such as plasma. For example, in one embodiment the thick gate oxide 248 and the additional or thicker oxide layer of the blocking layer 246 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of 800-1000° C. at a pressure approximately in the range of 0.5-10 Torr to form radicals, such as, an OH radical, an $HO_2$ radical or an O diradical radicals at a surface of the blocking layer 246. The oxidation process is carried out for a duration approximately in the range of 1-5 minutes for a single substrate using an ISSG process, or 10-15 minutes for a batch furnace process to effect growth of the blocking layer 246 having a thickness of from about 2 nm to about 4.5 nm, and a thick gate oxide 248 having a thickness of from about 3 nm to about 7 nm.

Figure 2N:
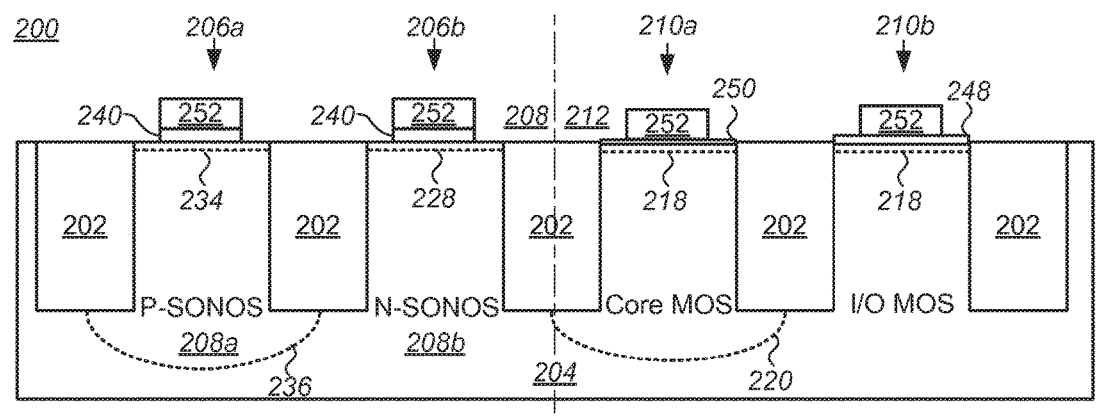
Figure 2O:
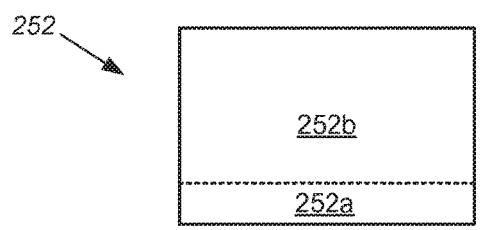

Next, referring to FIGS. 1 and 2N-2O, a gate layer is deposited and patterned to concurrently form a gates 252 for the MOS devices 210a, 210b, and the SONOS devices 206a, 206b (step 132). Generally, the gate layer is a conductive, conformal layer deposited over substantially the entire surface 216 of the substrate 204 and all layers and structures formed thereon. A patterned photoresist mask (not shown) is then formed using standard lithographic techniques and the gate layer etched to remove the gate layer from areas not protected by the mask, stopping on top surfaces of the gate oxides 248, 250, and the dielectric stack (blocking layer 246) of the SONOS devices 206a, 206b.

In one embodiment, the gate layer includes a doped polysilicon or poly layer deposited using chemical vapor deposition (CVD) to a thickness of from about 30 nm to about 100 nm, and etched using standard polysilicon etch chemistries, such as $CHF_3$ or $C_2H_2$ or $HBr/O_2$ which are highly selective to the underlying material of the gate oxides 248, 250 and the dielectric stack 240. The polysilicon can be doped using phosphorus implant for NMOS and Boron implant for PMOS transistors. The implant doses are in the range of 1E15 to $1E16/cm^2$ at energies of 2 to 50 KeV.

Referring to FIG. 2O, in some embodiments the gate layer is a multi-layer gate layer including one or more layers of a high work function or P+ metal, such as aluminum, Titanium or compounds or alloys thereof, in addition to or instead of polysilicon to form multi-layer gates 252 including a first, high work function metal layer 252a and a second polysilicon layer 252b.

Figure 2P:
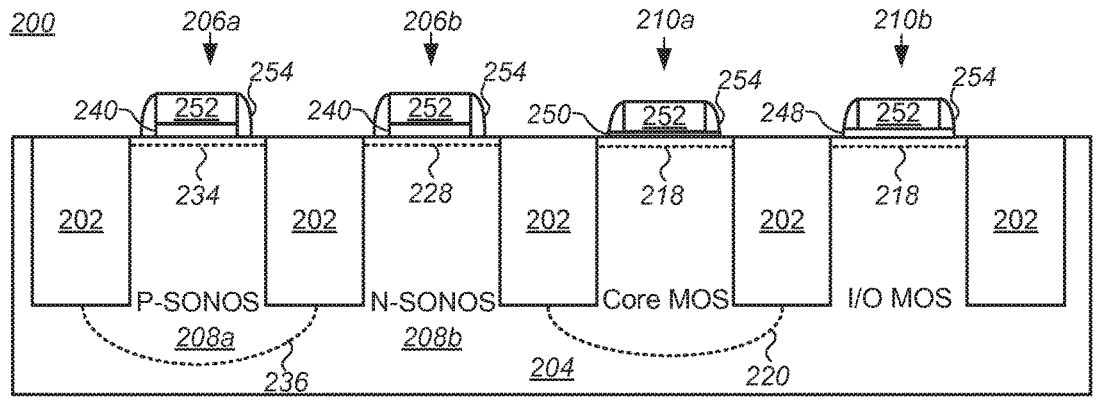

Referring to FIGS. 1 and 2P a spacer layer is deposited and etched to form sidewall spacers 254 (spacer 1) adjacent to the gates 252 of the MOS and SONOS devices (step 134). The spacer layer can include a conformal layer of a dielectric material, such as silicon oxide (SiO2) or silicon nitride (SiN), deposited to a thickness of from about 10 nm to about 30 nm, using any known CVD technique as described herein. In an embodiment, where the spacer layer 254 includes silicon nitride, the etch may be accomplished or performed in a number of different ways including, for example, a low pressure blanket or spacer etch at a moderate power (about 500 W) in a plasma of a fluorine containing gas, such as $CF_4$, or $CHF_3$. Because no mask is used and the etching is highly anisotropic, substantially all of the spacer layer is etched or removed from the exposed surface 216 of the substrate 204, as well as horizontal surface of the gates 252, parallel to the surface of the substrate leaving spacers 254 adjacent to sidewalls of the gates of the of the MOS and SONOS devices.

Referring to FIG. 2P, it is noted that in embodiments in which the spacer layer includes an oxide, such as silicon-dioxide ($SiO_2$), any of the dielectric stack 240 as well as any of the GOX 248, 250, remaining on the surface 216 of the substrate 204 and not covered by the gates 252 is advantageously removed along with portions of the spacer layer removed to form the spacers 254.

Figure 2Q:
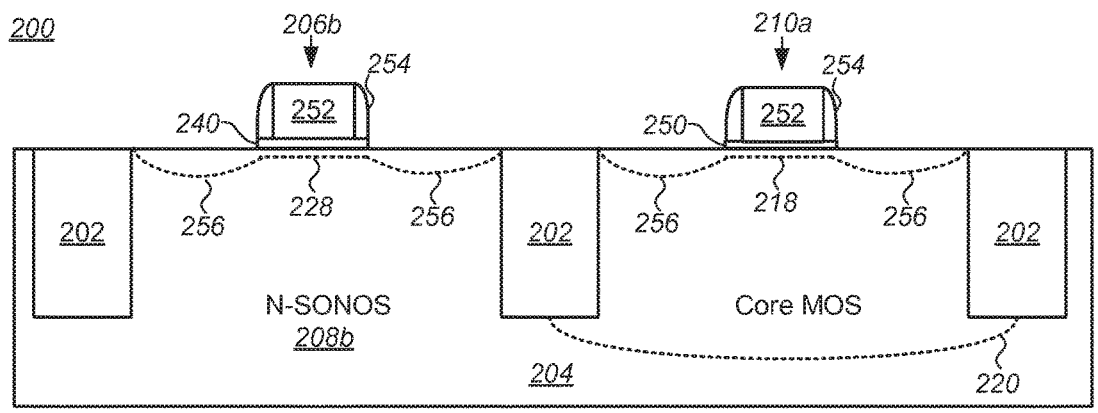

Referring to FIGS. 1 and 2Q, a patterned mask (not shown) is formed and source and drain (S/D) implants are performed to form source and drain (S/D) regions 256 for both the MOS devices 210a, 210b, and the SONOS devices 206a, 206b (step 136). The patterned mask can include a photoresist mask or a hardmask patterned to expose only the S/D regions of the SONOS and MOS devices. It is noted that in FIG. 2Q and following FIG. 2R only a portion of the substrate 204 including N-SONOS device 206b and core MOS device 210a are shown in order to more clearly show details of the S/D implants and silicides formed in subsequent step. It will be understood that as described in the detailed description above and below, the above S/D implant step as well as the silicides step below are performed on the P-SONOS device 206a and I/O MOS device 210b as well.

Figure 2R:
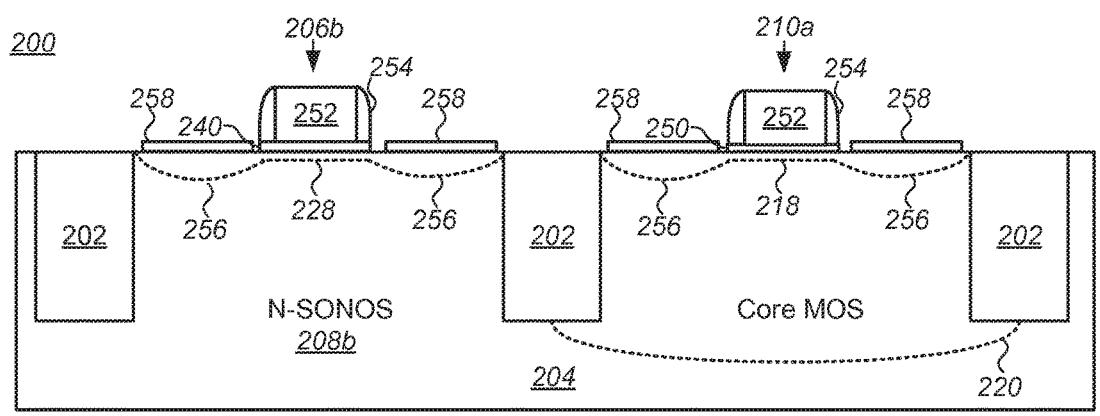
Figure 2S:
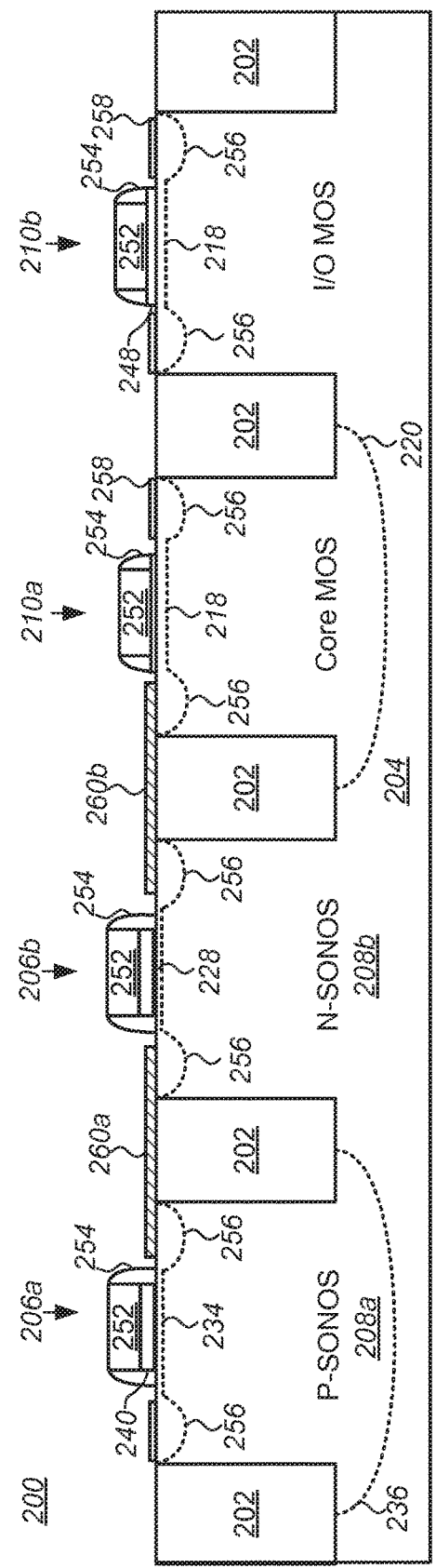

Referring to FIGS. 1, 2R and 2S, a silicide 258 is formed over the surface 216 of the substrate 204 in all S/D regions and a local interconnect and a metallization performed interconnecting some of the devices (step 138). The silicide process may be any commonly employed in the art, typically including a pre-clean etch, nickel metal deposition, anneal and wet strip. Advantageously, because the MOS devices 210a, 210b, and the complementary pair of SONOS devices (P-SONOS 206a and N-SONOS 206b) are integrally formed on the same substrate 204, the metallization process can be used to form a first metal layer 260a or local interconnect (LI) electrically coupling or connecting the drain of the N-SONOS device to the drain of the PSONOS device. Optionally, as shown in the sources of the P-SONOS device 206a and N-SONOS device 206b may be further connected by a second metal layer 260b or LI to one of the MOS devices 210a, 210b, as shown in FIG. 2S, or connected to ohmic contacts (not shown) formed in the substrate 204. The metallization process may be any commonly employed in the art, typically including a pre-clean etch, metal deposition by CVD or PECVD, anneal and wet strip. Suitable metals for the metallization process include titanium (Ti), tantalum (Ta), tungsten (W) and nitrides or alloys thereof. In one embodiment, the metal layers 260a, 260b, are tungsten (W) deposited by CVD over a titanium (Ti) seed layer, and a titanium-nitride (TiN) barrier layer.

Finally, the standard or baseline CMOS process flow is continued to substantially complete the front end fabrication a non-volatile memory including a pair of complementary SONOS devices integrally formed with a number of MOS devices, including at least one pair of CMOS devices.

Figure 3:
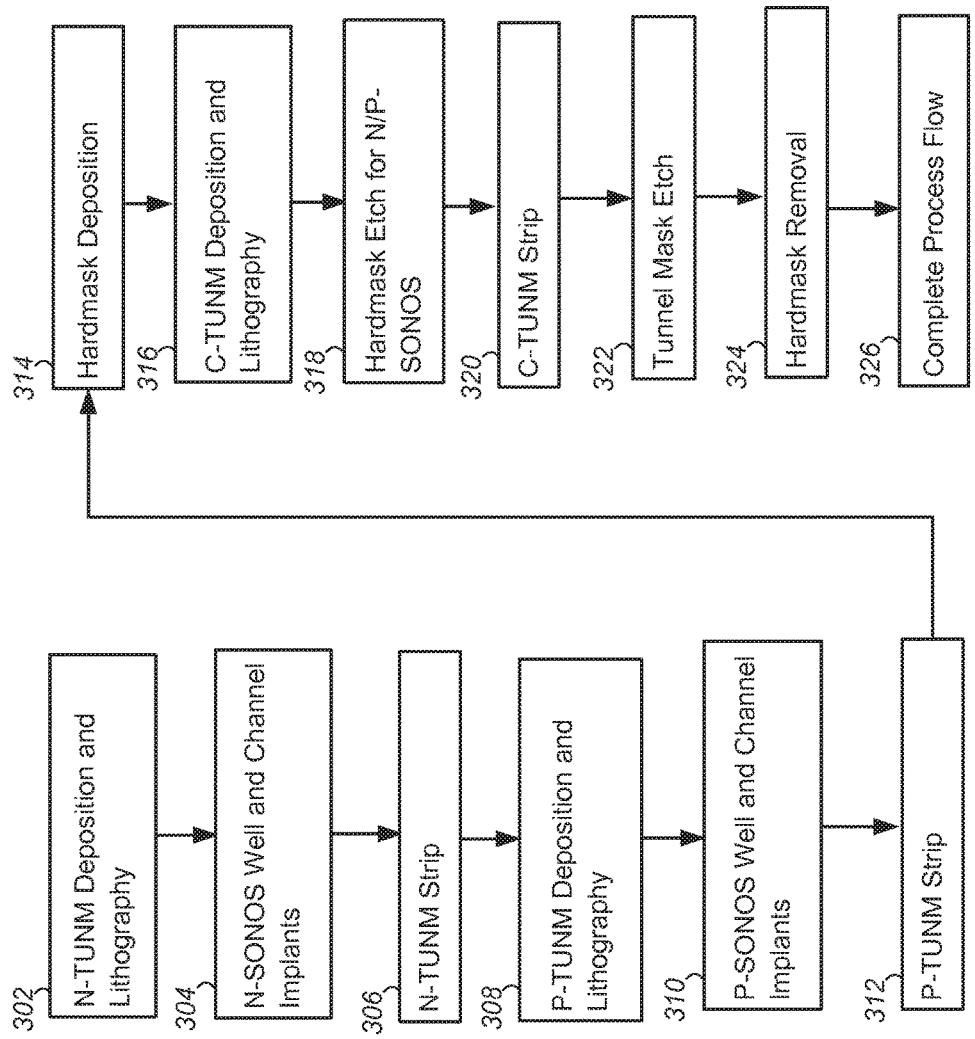
FIG. 3 is a flowchart illustrating another embodiment of a method for fabricating a memory cell including complementary SONOS devices and a metal-oxide-semiconductor (MOS) devices.

An embodiment of another method for integrating or embedding CSONOS into a CMOS process flow process flow will now be described in detail with reference to FIG. 3 and FIGS. 4A through 4J. FIG. 3 is a flowchart illustrating an embodiment of a method or process flow in which a hardmask is deposited over a surface of substrate after tunnel masks (TUNM) are formed for the CSONOS and SONOS wells and/or channels implanted. FIGS. 4A through 4J are block diagrams illustrating cross-sectional views of a portion of a memory cell 200, including a pair of complementary SONOS devices and a number of MOS devices, two of which are shown, during fabrication of the memory cell according to the method of FIG. 3.

As with the hardmask-first method described above the process begins with forming a number of isolation structures 202 in a wafer or substrate 204 and implanting dopants into substrate 204 through the pad oxide 214 to form channels 218 and wells 220 for one or more of the MOS devices 210a-210b. At this point the memory cell 200 is substantially identical to that described above following steps 102 and 104, and shown in FIG. 2A.

Figure 4A:
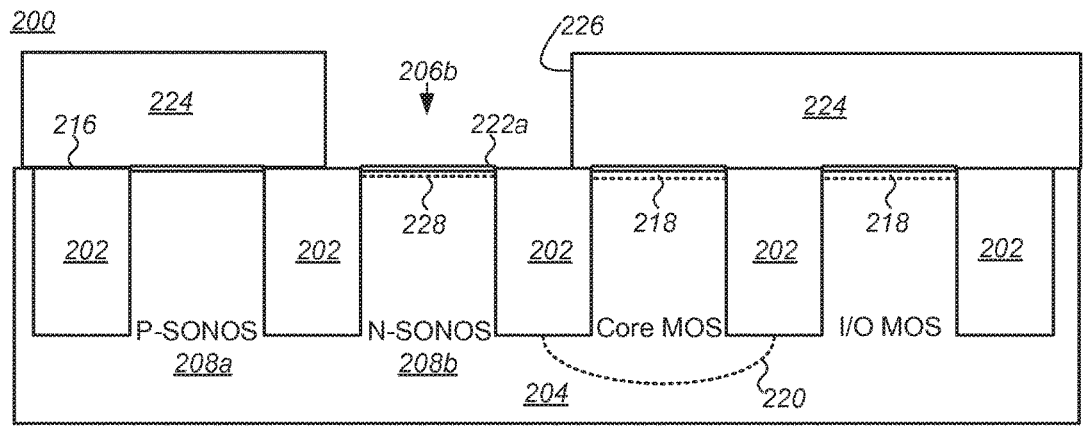

Next, referring to FIGS. 3 and 4A, a first tunnel mask (TUNM 224) is formed by depositing a photoresist layer on or overlying substantially an entire surface 216 of the substrate 204, patterning the photoresist layer using standard lithographic techniques (step 302). The deposition and patterning is accomplished in the same manner as that described in connection with step 108 above. It is noted that the pad oxides 214 isolates the surface 216 of the substrate 204 from the photoresist of first TUNM 224 in all active regions of the SONOS and MOS devices 206, 210.

Referring again to FIG. 3 and FIG. 4A, dopants of an appropriate energy and concentration are implanted through the pad oxide 214 to form a channel 228 for the N-SONOS device 206b, and, optionally, a well (not shown in this figure) in which the channel for the N-SONOS device is formed (step 304).

Figure 4B:
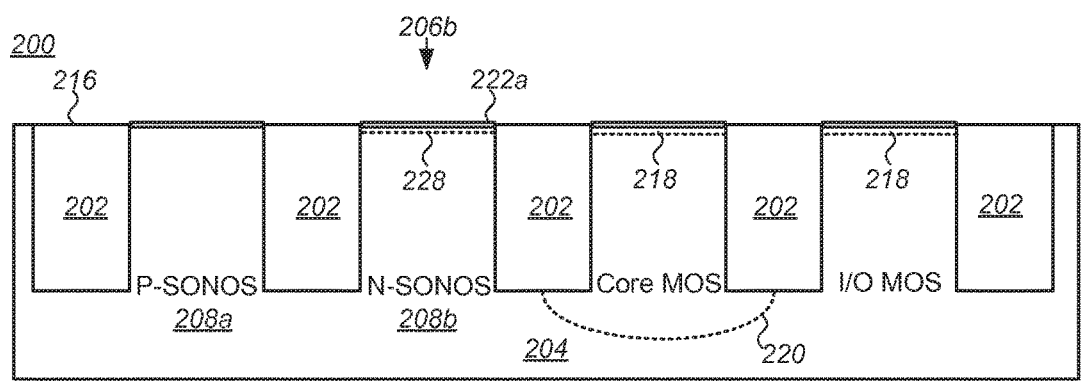

Referring to FIG. 3 and FIG. 4B, the first or N-TUNM 224 is removed or stripped in either an ashing process using oxygen plasma, or a photoresist strip or solvent (step 306).

Figure 4C:
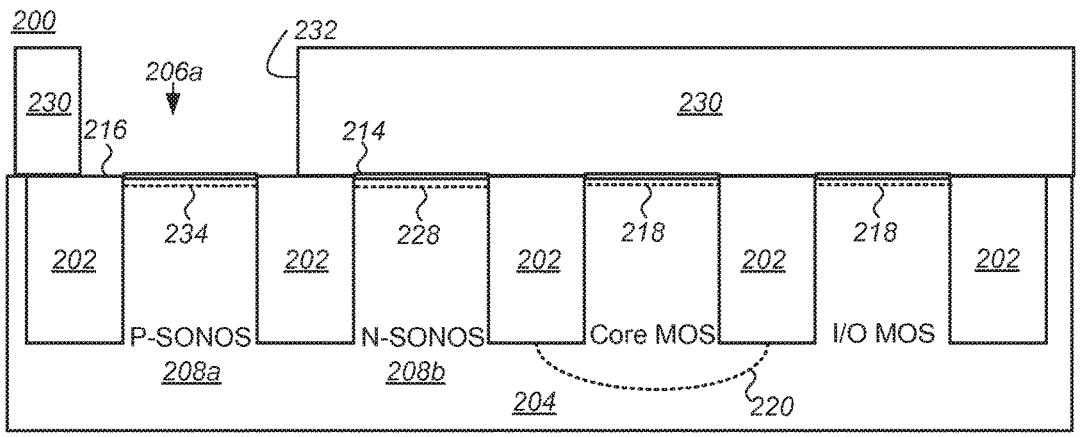

Next, referring to FIG. 3 and FIG. 4C, a second tunnel mask (TUNM 230) is formed by depositing a photoresist layer on or over substantially an entire surface of the surface 216 and patterned using standard lithographic techniques (step 308). Because an opening 232 in the patterned photoresist layer exposes the P-SONOS region 208a, the second TUNM 230 may also be referred to as the P-TUNM.

Referring again to FIG. 3 and FIG. 4C, dopants of an appropriate energy and concentration are implanted through the pad oxide 214 to form a channel 234 and a well or deep well 236 in which the P-SONOS device 206a is formed (step 310).

Figure 4D:
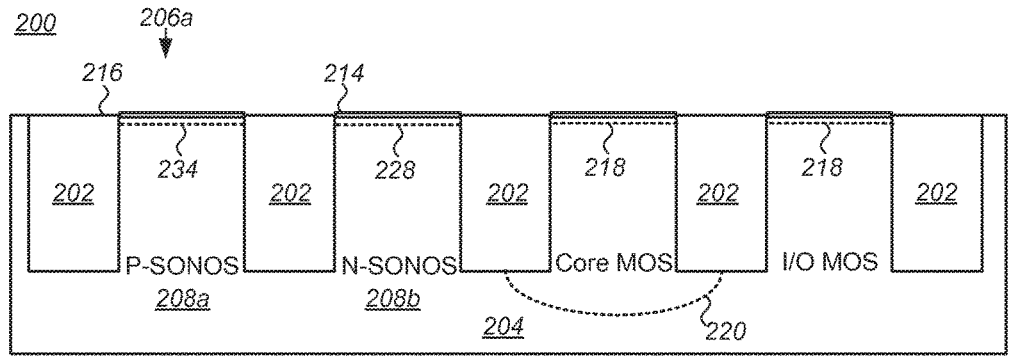

Referring to FIG. 3 and FIG. 4D, the second or P-TUNM 230 is removed or stripped in either an ashing process using oxygen plasma, or a photoresist strip or solvent (step 312).

Figure 4E:
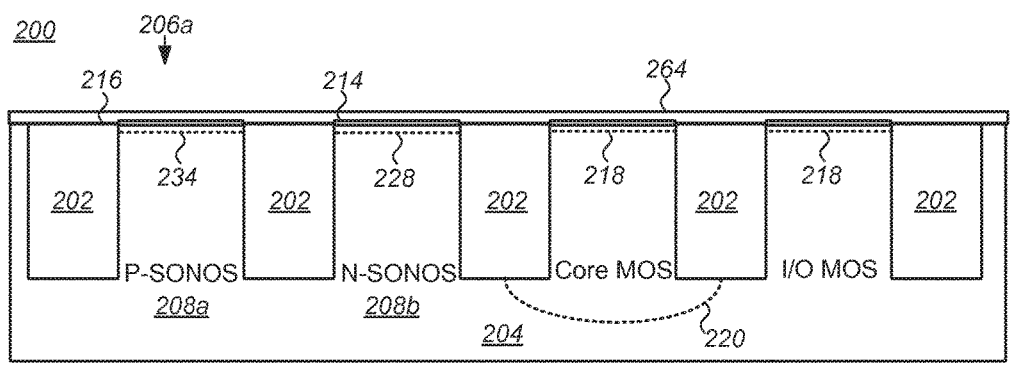

Next, referring to FIG. 3 and FIG. 4E a hardmask 264 is deposited over the surface 216 of the substrate 204 (step 314). The hardmask 264 is formed concurrently over both the P-SONOS region 208a and the N-SONOS region 208b. In some embodiments, such as that shown, the hardmask 264 is formed concurrently over substantially the entire surface 216 of the substrate 204, including both the P-SONOS region 208a and the N-SONOS region 208b and the MOS region 212.

Generally, the hardmask 264, like the hardmask 222 described above, can include one or more layers of material that can be patterned or opened using photoresist and standard lithographic techniques, but which is not itself photosensitive and protects underlying surface and structures formed therein from the photoresist and lithographic processes as well as from implants and etch process performed through openings formed in the hardmask. Suitable materials for the hardmask 264 include, for example, a layer of from about 5 to about 20 nm of silicon nitride ($Si_xN_y$), or silicon oxynitride (SiON) deposited by any known nitride deposition process. For example, in one embodiment a nitride hardmask is formed in step 314 in a low pressure chemical vapor deposition (LPCVD) process using a silicon source, such as silane ($SiH_4$), dichlorosilane ($SiH_2Cl_2$), tetrachlorosilane ($SiCl_4$) or Bis-TertiaryButylAmino Silane (BTBAS), and a nitrogen source, such as $NH_3$ and $N_2O$.

Figure 4F:
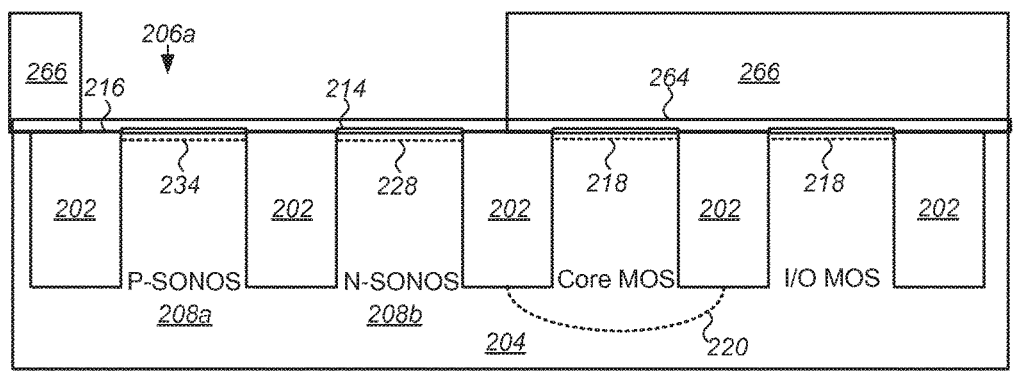

Next, referring to FIG. 3 and FIG. 4F, a third tunnel mask (TUNM 266) is formed by depositing a photoresist layer on or over substantially an entire surface of the hardmask 264, and patterned using standard lithographic techniques (step 316). Because an opening 268 in the patterned photoresist layer exposes a portion of the hardmask 264 in both the P-SONOS region 208a and the N-SONOS region 208b the third TUNM 266 may also be referred to as a complementary tunnel mask or C-TUNM.

Figure 4G:
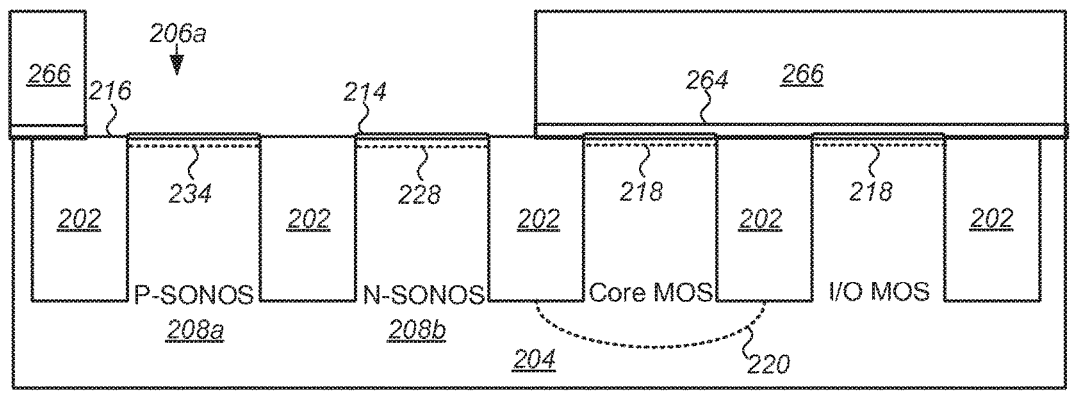

Referring to FIG. 3 and FIG. 4G, the portion of the hardmask 264 exposed through the opening 268 in the third or C-TUNM 266 is etched or removed using any suitable wet or dry etching technique, depending on the material of the hardmask and the underlying structures or layers (step 318). For example, as described above in connection with N-TUNM 224 and P-TUNM 230, in those embodiments in which the hardmask 264 includes a layer of silicon nitride overlying a pad oxide 214, the hardmask can be etched using a standard low pressure nitride etch at a moderate power (about 500 W) in a plasma of a fluorine containing gas, such as $CF_4$, or $CHF_3$, which exhibits good selectivity to silicon oxides, such as the silicon dioxide (SiO2) of the underlying pad oxide 214 and/or the STI 202 structures.

Figure 4H:
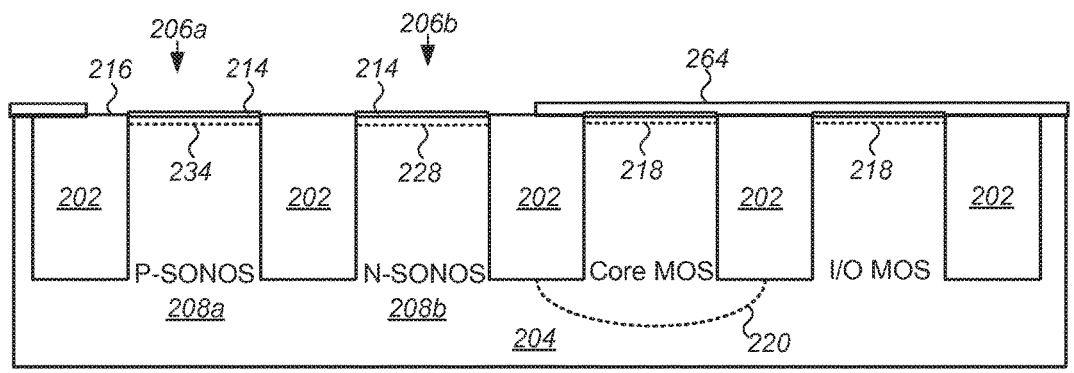

Referring to FIG. 3 and FIG. 4H, the second or C-TUNM 266 is removed or stripped in either an ashing process using oxygen plasma, or a photoresist strip or solvent (step 320).

Figure 4I:
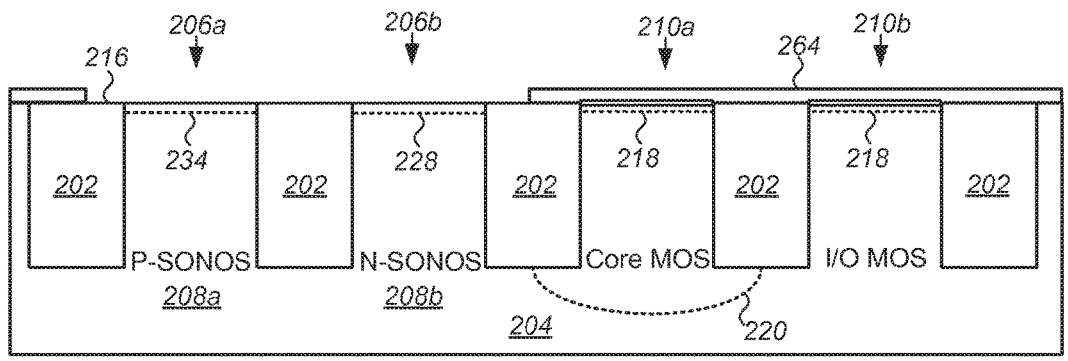

Next, referring to FIG. 3 and FIG. 4I, the pad oxide 214 over both the P-SONOS region 208a and the N-SONOS region 208b is concurrently removed in a tunnel mask etch through the opening formed in the hardmask 466 (step 322). The tunnel mask etch can be accomplished, for example, in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry.

Finally, referring to FIG. 3 and FIG. 4J, the hardmask 264 is substantially entirely stripped or removed (step 324). The hardmask 264 can be removed using the same process and chemistry previously used to form openings in the hardmask. For example, in embodiments in which the hardmask 264 includes a silicon nitride layer, it can be removed using a standard low pressure nitride etch at a moderate power (about 500 W) in a plasma of a fluorine containing gas, such as $CF_4$, or $CHF_3$, which exhibits good selectivity to silicon oxides, such as the silicon dioxide (SiO2) of the pad oxide 214 remaining over the MOS devices 210a-210b in the MOS region 212 and the STI 202 structures, and to the underlying silicon of the substrate in the SONOS region 208. The silicon nitride can also be removed by a wet etch using Phosphoric acid ($H_3PO_4$) at a temperature of about 150° C. to 160 C.

The method then continues as provided in steps 128 through 138 as described above, and a standard or baseline CMOS process flow is performed to substantially complete the front end fabrication of a non-volatile memory including a pair of complementary SONOS devices integrally formed with a number of MOS devices, including at least one pair of CMOS devices.

In an alternative embodiment of either of the methods shown in FIGS. 1 and 3, prior to depositing the hardmask 222/264 a well or wells are concurrently implanted for at least one of the number of MOS devices in the MOS region and a well for one of the pair of complementary SONOS devices in the P-SONOS region or the N-SONOS region. FIG. 5 is a block diagram illustrating cross-sectional views of a portion of a memory cell fabricated to include a deep Nwell 270 concurrently formed in the P-SONOS region 208a and the MOS region 212 in which the core MOS 210a is subsequently formed. As noted above, the deep Nwell 270 can be implanted with Arsenic or Phosphorous at an energy of from about 500 to about 2000 kilo-electron volts (keV), and a dose of from about $5E12/cm^2$ to about $2E13/cm^2$ to form a deep Nwell. Furthermore, although the P-SONOS region 208a is shown as having been relocated to be adjacent to the MOS region 212 in which the core MOS 210a is formed and the deep Nwell 270 is shown as being one contiguous well, it will be understood that this need not be the case in every embodiment, and the wells can concurrently be formed while remaining separate or non-contiguous by appropriate patterning of an implant mask.

Thus, embodiments of methods for fabricating memory cells including embedded or integrally pair of complementary SONOS devices and a number of MOS devices have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. An integrated circuit, comprising:
    a substrate;
    a p-type silicon-oxide-nitride-oxide-semiconductor (P-SONOS) transistor disposed on the substrate in a SONOS region, the P-SONOS transistor comprising a first channel above a well;
    an n-type silicon-oxide-nitride-oxide-semiconductor (N-SONOS) transistor disposed on the substrate in the SONOS region, the N-SONOS transistor comprising a second channel;
    a p-type metal-oxide-semiconductor (PMOS) transistor disposed on the substrate in a core region adjacent the SONOS region, the PMOS transistor comprising low-voltage field effect core transistor including a third channel above the well,
    wherein the well above which the P-SONOS transistor and the PMOS transistor are disposed comprises a single contiguous deep well of n-type material, the P-SONOS transistor and the PMOS transistor are isolated at a surface of the substrate by a first trench isolation structure that does not extend through a full depth of the deep well, and a first source/drain (S/D) region of the P-SONOS transistor abuts the first trench isolation structure and is connected with a S/D region of the PMOS transistor which abuts the first trench isolation structure by a first local interconnect (LI) formed over the first trench isolation structure.

2. The integrated circuit of claim 1, further comprising a non-volatile memory (NVM) cell comprising the P-SONOS transistor, the N-SONOS transistor and the PMOS transistor.

3. The integrated circuit of claim 2, the NVM cell further comprising an n-type metal-oxide-semiconductor (NMOS) transistor disposed on the substrate.

4. The integrated circuit of claim 3, wherein the NMOS and PMOS are a pair of complementary metal-oxide-semiconductor (MOS) transistors in the core region.

5. The integrated circuit of claim 2, the NVM cell further comprising an input/output circuit comprising a high-voltage PMOS transistor.

6. The integrated circuit of claim 5, wherein the input/output circuit further comprises a high-voltage NMOS transistor.

7. The integrated circuit of claim 1, further comprising a second trench isolation structure disposed on the substrate between the P-SONOS transistor and the N-SONOS transistor.

8. The integrated circuit of claim 7, wherein a second S/D region of the P-SONOS transistor is connected with a S/D region of the N-SONOS transistor by a second local formed over the second trench isolation structure.

9. An integrated circuit, comprising:
   a substrate;
   a p-type silicon-oxide-nitride-oxide-semiconductor (P-SONOS) transistor disposed on the substrate above a well in a SONOS region;
   an n-type silicon-oxide-nitride-oxide-semiconductor (N-SONOS) transistor disposed on the substrate in the SONOS region;
   a p-type metal-oxide-semiconductor (PMOS) transistor disposed on the substrate above the well in a core region adjacent the SONOS region,
   wherein the well above which the P-SONOS transistor and the PMOS transistor are disposed comprises a single contiguous deep well of n-type material, the P-SONOS transistor and the PMOS transistor are isolated at a surface of the substrate by a first trench isolation structure, and a first source/drain (S/D) region of the P-SONOS transistor extending from a channel of the P-SONOS transistor to the trench isolation structure and is electrically coupled to a S/D region of the PMOS transistor extending from a channel of the PMOS transistor to the trench isolation structure by a local interconnect (LI) formed over the isolation structure.

10. The integrated circuit of claim 9, further comprising a non-volatile memory (NVM) cell comprising the P-SONOS transistor, the N-SONOS transistor and the PMOS transistor.

11. The integrated circuit of claim 10, the NVM cell further comprising an n-type metal-oxide-semiconductor (NMOS) transistor disposed on the substrate.

12. The integrated circuit of claim 11, wherein the NMOS and PMOS are a pair of complementary metal-oxide-semiconductor (MOS) transistors in the core region.

13. The integrated circuit of claim 10, the NVM cell further comprising an input/output circuit comprising a high-voltage PMOS transistor.

14. The integrated circuit of claim 13, wherein the input/output circuit further comprises a high-voltage NMOS transistor.

15. The integrated circuit of claim 9, further comprising a second trench isolation structure disposed on the substrate between the P-SONOS transistor and the N-SONOS transistor.

16. The integrated circuit of claim 15, wherein a second S/D region of the P-SONOS transistor is connected with a S/D region of the N-SONOS transistor by a second LI formed over the second trench isolation structure.

17. The integrated circuit of claim 10, further comprising a pair of high-voltage complementary metal-oxide-semiconductor (MOS) transistors disposed on the substrate in an input/output (I/O) region, the I/O region separated from the SONOS region by the core region.

18. An integrated circuit, comprising:
   a complementary pair of silicon-oxide-nitride-oxide-semiconductor (CSONOS) transistors, including an n-type SONOS (N-SONOS) transistor disposed on a substrate in a SONOS region, and a p-type SONOS (P-SONOS) transistor disposed on the substrate above a well in the SONOS region;
   a p-type metal-oxide-semiconductor (PMOS) transistor disposed on the substrate above the well in a core region adjacent the SONOS region,
   wherein the well above which the P-SONOS transistor and the PMOS transistor are disposed comprises a single contiguous deep well of n-type material, the P-SONOS transistor and the PMOS transistor are isolated at a surface of the substrate by a first trench isolation structure, and a first source/drain (S/D) region of the P-SONOS transistor extending from a channel of the P-SONOS transistor to the trench isolation structure and is electrically coupled to a S/D region of the PMOS transistor extending from a channel of the PMOS transistor to the trench isolation structure by a local interconnect (LI) formed over the isolation structure.

19. The integrated circuit of claim 18, further comprising a second trench isolation structure disposed on the substrate between the P-SONOS transistor and the N-SONOS transistor.

20. The integrated circuit of claim 19, wherein a second S/D region of the P-SONOS transistor is connected with a S/D region of the N-SONOS transistor by a second LI formed over the second trench isolation structure.

21. The integrated circuit of claim 18, further comprising an n-type metal-oxide-semiconductor (NMOS) transistor disposed on the substrate in the core region, and wherein the NMOS and PMOS are a pair of low-voltage complementary metal-oxide-semiconductor (MOS) transistors.

* * * * *